(12) United States Patent
Kimura

(10) Patent No.: US 11,609,312 B2
(45) Date of Patent: *Mar. 21, 2023

(54) SIGNAL PROCESSING DEVICE CONTROLLING A GAIN OF A CURRENT SIGNAL

(71) Applicant: DENSO CORPORATION, Kariya (JP)

(72) Inventor: Shunsuke Kimura, Kariya (JP)

(73) Assignee: DENSO CORPORATION, Kariya (JP)

(*) Notice: Subject to any disclaimer, the term of this patent is extended or adjusted under 35 U.S.C. 154(b) by 381 days.

This patent is subject to a terminal disclaimer.

(21) Appl. No.: 16/860,539

(22) Filed: Apr. 28, 2020

(65) Prior Publication Data

US 2020/0256962 A1 Aug. 13, 2020

Related U.S. Application Data

(63) Continuation of application No. PCT/JP2018/040196, filed on Oct. 29, 2018.

(30) Foreign Application Priority Data

Oct. 30, 2017 (JP) ............................. JP2017-208987

(51) Int. Cl.
   *G01S 7/4861* (2020.01)
   *G01S 7/40* (2006.01)
   (Continued)

(52) U.S. Cl.
   CPC .......... *G01S 7/4861* (2013.01); *G01S 7/4004* (2013.01); *G01S 7/489* (2013.01); *G01S 17/66* (2013.01);
   (Continued)

(58) Field of Classification Search
   CPC ...... G01S 7/4861; G01S 7/4004; G01S 7/489; G01S 17/66; G01S 7/34; G01S 17/89;
   (Continued)

(56) References Cited

U.S. PATENT DOCUMENTS

2005/0082500 A1 4/2005 Yamaguchi
2015/0244469 A1* 8/2015 Murayama .......... H04J 14/0227
                                                   398/34
(Continued)

FOREIGN PATENT DOCUMENTS

JP    S54-072059 A    5/1979
JP    S54-072059 U    5/1979
(Continued)

*Primary Examiner* — Jennifer D Bennett
*Assistant Examiner* — Erin R Garber
(74) *Attorney, Agent, or Firm* — Maschoff Brennan

(57) ABSTRACT

In a signal processing device, a branch section generates, from an input signal which is a current signal, a plurality of branch signals that are proportional to the input signal and have different signal intensities, and supplies the plurality of branch signals to respective different individual paths. A selection section selects one of the plurality of individual paths and outputs a signal supplied through the selected individual path. A determination section determines whether in each of the plurality of individual paths, a magnitude of a signal supplied to the selection section is in a preset allowable range. A control section causes the selection section to select the individual path having a highest gain among the individual paths in which the magnitude of the signal is determined by the determination section to be in the allowable range.

17 Claims, 15 Drawing Sheets

(51) Int. Cl.
- *G01S 7/489* (2006.01)
- *G01S 17/66* (2006.01)
- *H03F 3/08* (2006.01)
- *G01S 17/931* (2020.01)
- *H03F 3/45* (2006.01)

(52) U.S. Cl.
CPC .............. *G01S 17/931* (2020.01); *H03F 3/08* (2013.01); *H03F 3/087* (2013.01); *H03F 3/45475* (2013.01); *H03F 2200/451* (2013.01)

(58) Field of Classification Search
CPC ...... G01S 7/4817; G01S 13/88; G01S 13/003; G01S 13/87; G01S 13/426; G01S 13/931; H03F 2200/451; H03F 3/08; H03F 3/087; H03F 3/45475; H03F 3/195

See application file for complete search history.

(56) References Cited

U.S. PATENT DOCUMENTS

| | | | |
|---|---|---|---|
| 2016/0274246 A1* | 9/2016 | Kimura | G01T 1/17 |
| 2018/0313688 A1* | 11/2018 | Dieguez Barrientos | H03K 5/1534 |
| 2020/0256957 A1* | 8/2020 | Kimura | H03G 1/0088 |

FOREIGN PATENT DOCUMENTS

| | | |
|---|---|---|
| JP | H06-75048 A | 3/1994 |
| JP | H07-058562 A | 3/1995 |
| JP | H11-298259 A | 10/1999 |
| JP | 2016-014535 A | 1/2016 |
| JP | 2016-178432 A | 10/2016 |

* cited by examiner

SIGNAL PROCESSING DEVICE CONTROLLING A GAIN OF A CURRENT SIGNAL

CROSS-REFERENCE TO RELATED APPLICATION

This international application claims the benefit of priority from Japanese Patent Application No. 2017-208987 filed with the Japan Patent Office on Oct. 30, 2017, the entire description of which is incorporated herein by reference.

BACKGROUND

Technical Field

The present disclosure relates to a signal processing device that controls a gain of a current signal.

Related Art

Laser radar devices perform various types of processing by using a result of analog-digital (hereinafter referred to as AD) conversion of a light reception signal. Due to the necessity of detecting various objects ranging from objects located at a short distance to objects located at a long distance, the laser radar devices are known to handle light reception signals having a very wide range of intensities. When a light reception signal exceeding an input range of an AD converter is inputted, an output of the AD converter is saturated at full scale and waveform information is lost, and this causes deterioration in measurement accuracy.

SUMMARY

As an aspect of the present disclosure, a signal processing device includes: a branch section configured to generate, from an input signal which is a current signal, a plurality of branch signals that are proportional to the input signal and have different signal intensities and to supply the plurality of branch signals to respective different individual paths; a selection section configured to select one of the plurality of individual paths and output a signal supplied through the selected individual path; a determination section configured to determine whether in each of the plurality of individual paths, a magnitude of a signal supplied to the selection section is in a preset allowable range; and a control section configured to cause the selection section to select the individual path having a highest gain among the individual paths in which the magnitude of the signal is determined by the determination section to be in the allowable range.

DETAILED DESCRIPTION OF THE PREFERRED EMBODIMENTS

Laser radar devices perform various types of processing by using a result of analog-digital (hereinafter referred to as AD) conversion of a light reception signal. Due to the necessity of detecting various objects ranging from objects located at a short distance to objects located at a long distance, the laser radar devices are known to handle light reception signals having a very wide range of intensities. When a light reception signal exceeding an input range of an AD converter is inputted, an output of the AD converter is saturated at full scale and waveform information is lost, and this causes deterioration in measurement accuracy.

In this regard, for example, JP 2016-178432 A discloses a technique in which a light reception signal is divided into a plurality of signals having different gains and a signal to be supplied to a later stage is appropriately selected to optimize the gain.

As a result of detailed study by the inventor, however, it has been found that the conventional technique described in JP 2016-178432 A has the following problem. Specifically, the conventional technique performs what is called feedback control in which gain control is performed by using the previous input signal. Therefore, although the conventional technique is effective in a situation where light signals having the same intensity are continuously received, in a situation where light signals having varying intensities are received singly, the gain has not been able to be optimized.

An aspect of the present disclosure is to provide a technique of optimizing a gain without using feedback control.

Embodiments of the present disclosure will be described with reference to the drawings.

1. First Embodiment

1-1. Configuration

A laser radar device 1 of the present embodiment is installed in a vehicle, detects various objects that are present around the vehicle, and generates information on the objects.

Figure 1:
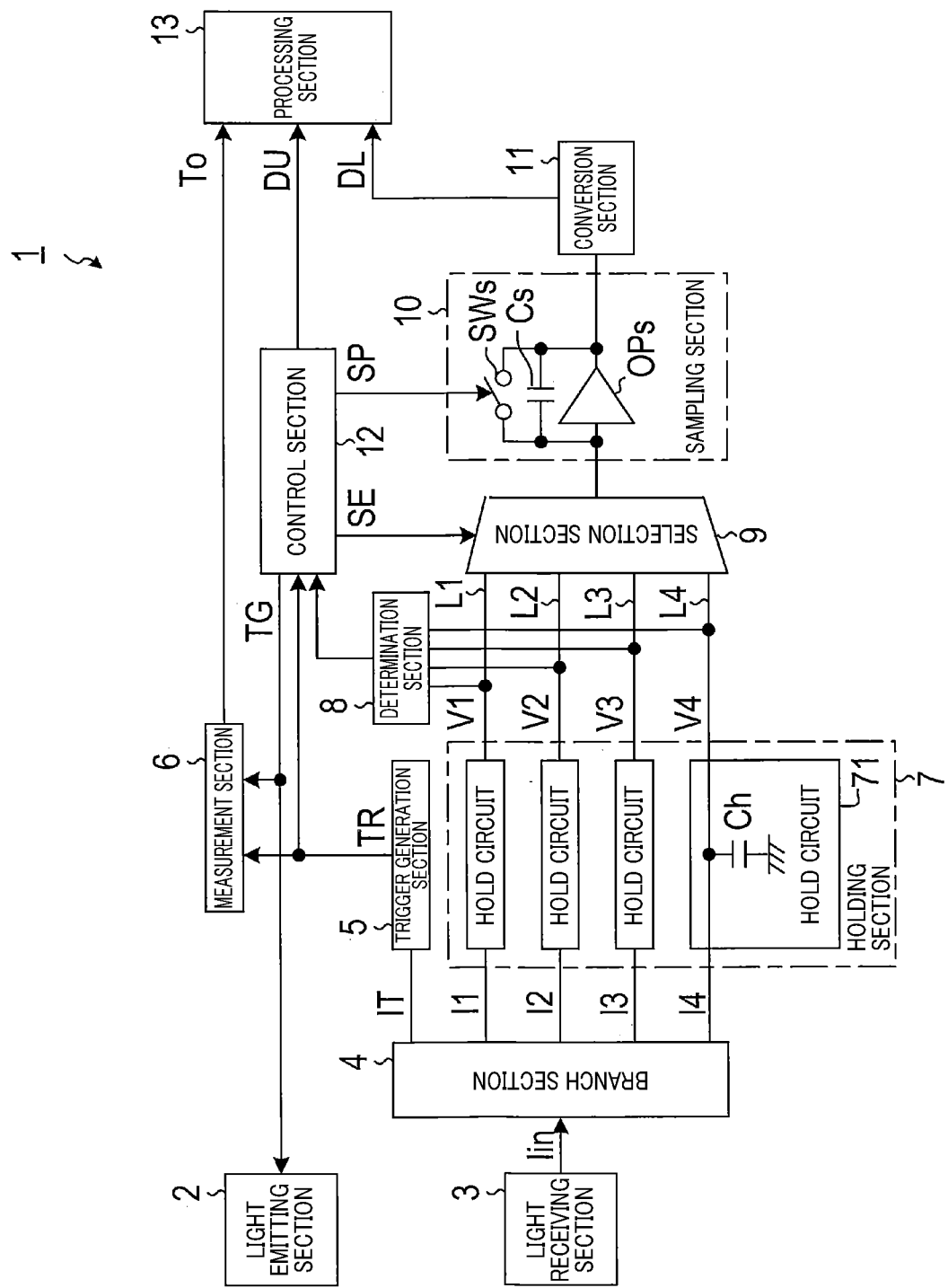
FIG. 1 is a block diagram showing a configuration of a laser radar device according to a first embodiment.

As shown in FIG. 1, the laser radar device 1 includes a light emitting section 2, a light receiving section 3, a branch section 4, a trigger generation section 5, a measurement section 6, a holding section 7, a determination section 8, a selection section 9, a sampling section 10, a conversion section 11, a control section 12, and a processing section 13. The branch section 4, the determination section 8, the selection section 9, and the control section 12 correspond to a signal processing device. The signal processing device may include the holding section 7. The signal processing device may include the sampling section 10 and the conversion section 11.

The light emitting section 2 includes one or more light emitting elements, and emits a pulse laser beam toward a preset search range according to a light emission trigger signal TG from the control section 12. The light emitting element is, for example, a laser diode.

The light receiving section 3 includes one or more light receiving elements, and receives a laser beam coming from the search range and outputs a light reception signal Iin having a current value corresponding to a light reception intensity of the laser beam. The light receiving element is, for example, a photodiode (i.e., PD), an avalanche photodiode (i.e., APD), or the like. When the APD is used, the light receiving element may be what is called a Single Photon Avalanche Diode (i.e., SPAD) which is operated in Geiger mode.

On the basis of the light reception signal Iin from the light receiving section 3 which is an input signal, the branch section 4 generates a plurality of branch signals I1 to I4 and a distance measurement signal IT that are proportional to the light reception signal Iin and have different magnitudes. The plurality of branch signals I1 to I4 are supplied to the holding section 7, and the distance measurement signal IT is supplied to the trigger generation section 5. In this case, the number of branch signals is four, but the number of branch signals may be two or three, or five or more.

Figure 2:
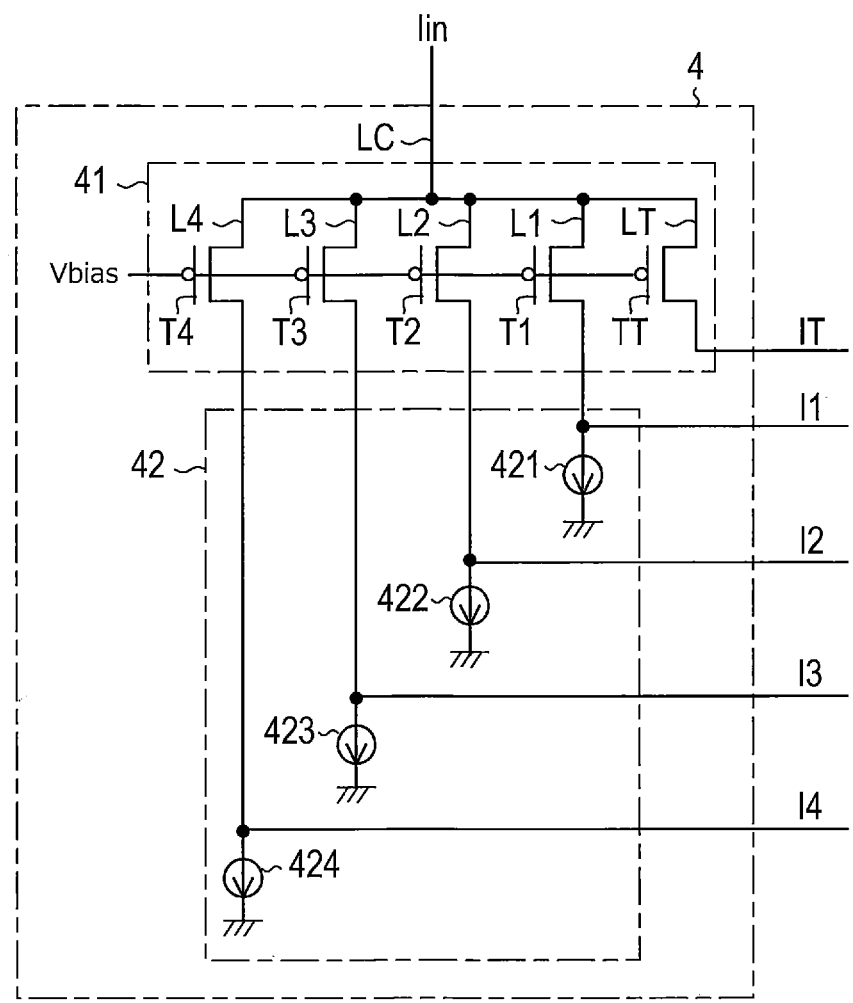
FIG. 2 is a circuit diagram showing a configuration of a branch section.

Specifically, as shown in FIG. 2, the branch section 4 includes a shunt circuit 41 and a bias removal circuit 42. In this case, the light reception signal Iin is a positive signal (i.e., a current source signal), but the light reception signal Iin may be a negative signal (i.e., a current sink signal). When the negative signal is used, the polarity of a transistor (described later) needs to be inverted. Specifically, PMOS should be changed to NMOS, NMOS should be changed to PMOS, and grounded NMOS should be changed to PMOS connected to a power source.

The shunt circuit 41 includes five individual paths LT and L1 to L4 each of which has an end connected to a common path LC to which the light reception signal Iin is inputted. The individual paths LT and L1 to L4 are connected to transistors TT and T1 to T4, respectively. The transistors TT and T1 to T4 are all p-channel MOS transistors. In each of the transistors TT and T1 to T4, a source is connected to the common path LC, and the same bias voltage Vbias is applied to a gate. A drain of the transistor TT provided in the individual path LT is connected to the trigger generation section 5. A current signal outputted from the drain of the transistor TT is the distance measurement signal IT. Drains of the transistors T1 to T4 are grounded via constant current circuits 421 to 424 for removing bias. The drains of the transistors T1 to T4 are each also connected to the holding section 7. Current signals outputted from the drains of the transistors T1 to T4 are the branch signals I1 to I4, Shape ratios W/L of the transistors TT and T1 to T4 are set so that the transistors TT and T1 to T4 have different gains. Note that W represents a channel width and L represents a channel length. In this case, the shape ratios W/L of the transistors TT and T1 to T4 are set to 500:500:100:10:1. Thus, the branch section 4 divides the light reception signal Iin into the distance measurement signal IT at a division ratio of 500/1111, the branch signal I1 at a division ratio of 500/1111, the branch signal I2 at a division ratio of 100/1111, the branch signal I3 at a division ratio of 10/1111, and the branch signal I4 at a division ratio of 1/1111, and then outputs the signals.

Returning to FIG. 1, the trigger generation section 5 generates a light reception trigger signal TR that indicates a timing at which an intensity of the distance measurement signal IT exceeds a preset light reception threshold.

The measurement section 6 outputs time data To obtained by measuring a time from when the light emission trigger signal TG is inputted to when the light reception trigger signal TR is inputted. The measured time is time required for a laser beam to travel back and forth to a target, and is thus a value proportional to a distance to the target. The target is an object that reflects a laser beam emitted from the light emitting section 2.

The holding section 7 includes four hold circuits 71 provided in the respective individual paths L1 to L4. The hold circuits 71 all include capacitors Ch having the same capacitance. However, the capacitors Ch do not necessarily need to have the same capacitance. One end of the capacitor Ch is connected to an individual path Li, and the other end of the capacitor Ch is grounded. Note that i represents integers 1 to 4. Thus, the capacitor Ch integrates a branch current Ii that flows through the individual path Li. The hold circuit 71 outputs a voltage at both ends of the capacitor Ch as a detection signal Vi to the determination section 8 and the selection section 9.

The determination section 8 determines whether a signal level of the detection signals V1 to V4 outputted from the holding section 7 is higher than a preset saturation threshold THs. When an input range of the sampling section 10 is smaller than an output range of the branch section 4, the saturation threshold THs is set so that an input to the sampling section 10 is smaller than an upper limit value of the input range of the sampling section 10, and is set to, for example, approximately ⅘ to ¾ of the upper limit value of the input range. When the input range of the sampling section 10 is larger than the output range of the branch section 4, the saturation threshold THs is set so that an input to the sampling section 10 is smaller than a preset upper limit value, and is set to, for example, approximately ⅘ to ¾ of an upper limit value of a potential. The input range refers to a range in which an input signal can be AD-converted with a linear characteristic by the conversion section 11. The upper limit value refers to an upper limit value of a potential at which the branch section 4 can output the input current Iin to the holding section 7 with a linear characteristic. A range in which the signal level is the saturation threshold THs or less corresponds to an allowable range.

Note that H1 to H4 represent determination results of the detection signals V1 to V4, respectively, and Hi=1 when the signal level is higher than the saturation threshold THs, and Hi=0 when the signal level is the saturation threshold THs or less. Among the individual paths L1 to L4, a gain of the individual path L1 is highest, and the gain is reduced in the order of the individual paths L2, L3, and L4. Thus, when the determination result is represented by {H1, H2, H3, H4}, the determination result is one of {0000}, {1000}, {1100}, {1110}, and {1111}.

The selection section 9 selects one of the individual paths L1 to L4 according to a selection signal SE from the control section 12, and connects the selected individual path Li to the sampling section 10 at a later stage.

The sampling section 10 includes an operational amplifier OPs, a capacitor Cs, and a switch SWs. The capacitor Cs and the switch SWs are connected in parallel to each other between an inverting input and an output of the operational amplifier OPs. A non-inverting input of the operational amplifier Ops is grounded.

In a standby state of the sampling section 10, when the switch SWs is turned on by a sampling signal SP, electric charge of the capacitor Cs are cleared. When the switch SWs is turned off by a sampling signal SP, electric charge stored in the capacitor Ch of the hold circuit 71 in the individual path Li selected by the selection section 9 are transferred to the capacitor Cs of the sampling section 10 and held while the switch SWs is OFF. Thus, the magnitude of an output of the sampling section 10 corresponds to a detection signal Vi of the selected individual path Li, i.e., an integrated value of the branch signal Ii.

The conversion section 11 includes an AD converter that performs analog-digital conversion of an output from the sampling section 10. In this case, an analog signal having a signal intensity in the input range is converted into a 10-bit digital value DL.

The control section 12 repeatedly outputs a light emission trigger signal TG at preset intervals. Hereinafter, a cycle in which the light emission trigger signal TG is outputted is referred to as measurement cycle. When a light reception trigger signal TR is inputted from the trigger generation section 5, the control section 12 generates a delay trigger signal dTR obtained by delaying the light reception trigger signal TR by a preset delay time DLY. According to the delay trigger signal dTR, the control section 12 generates a selection signal SE and a sampling signal SP.

According to the determination result obtained by the determination section 8, when the determination result is {0000}, the control section 12 outputs a selection signal SE that causes the selection section 9 to select the individual path L1, when the determination result is {0001}, the control section 12 outputs a selection signal SE that causes the selection section 9 to select the individual path L2, when the determination result is {0011}, the control section 12 outputs a selection signal SE that causes the selection section 9 to select the individual path L3, and when the determination result is {0111} or {1111}, the control section 12 outputs a selection signal SE that causes the selection section 9 to select the individual path L4. Thus, among the individual paths in which the signal level of the detection signal is determined to be the saturation threshold THs or less, the individual path having the highest gain is selected by the selection section 9.

Furthermore, according to the determination result obtained by the determination section 8, the control section 12 outputs a 2-bit digital value DU to the processing section 13. Specifically, the control section 12 outputs DU=00 when the determination result is {0000}, outputs DU=01 when the determination result is {0001}, outputs DU=10 when the determination result is {0011}, and outputs DU=11 when the determination result is {0111} or {1111}.

The processing section 13 generates information on the target by using intensity data indicating a reception intensity and distance data indicating a distance to the target. As the intensity data, a 12-bit AD conversion value is used in which a low-order bit is the digital value DL from the conversion section 11 and a high-order bit is the digital value DU from the control section 12. As the distance data, the time data To from the measurement section 6 is used.

1-2. Operation

Figure 3:
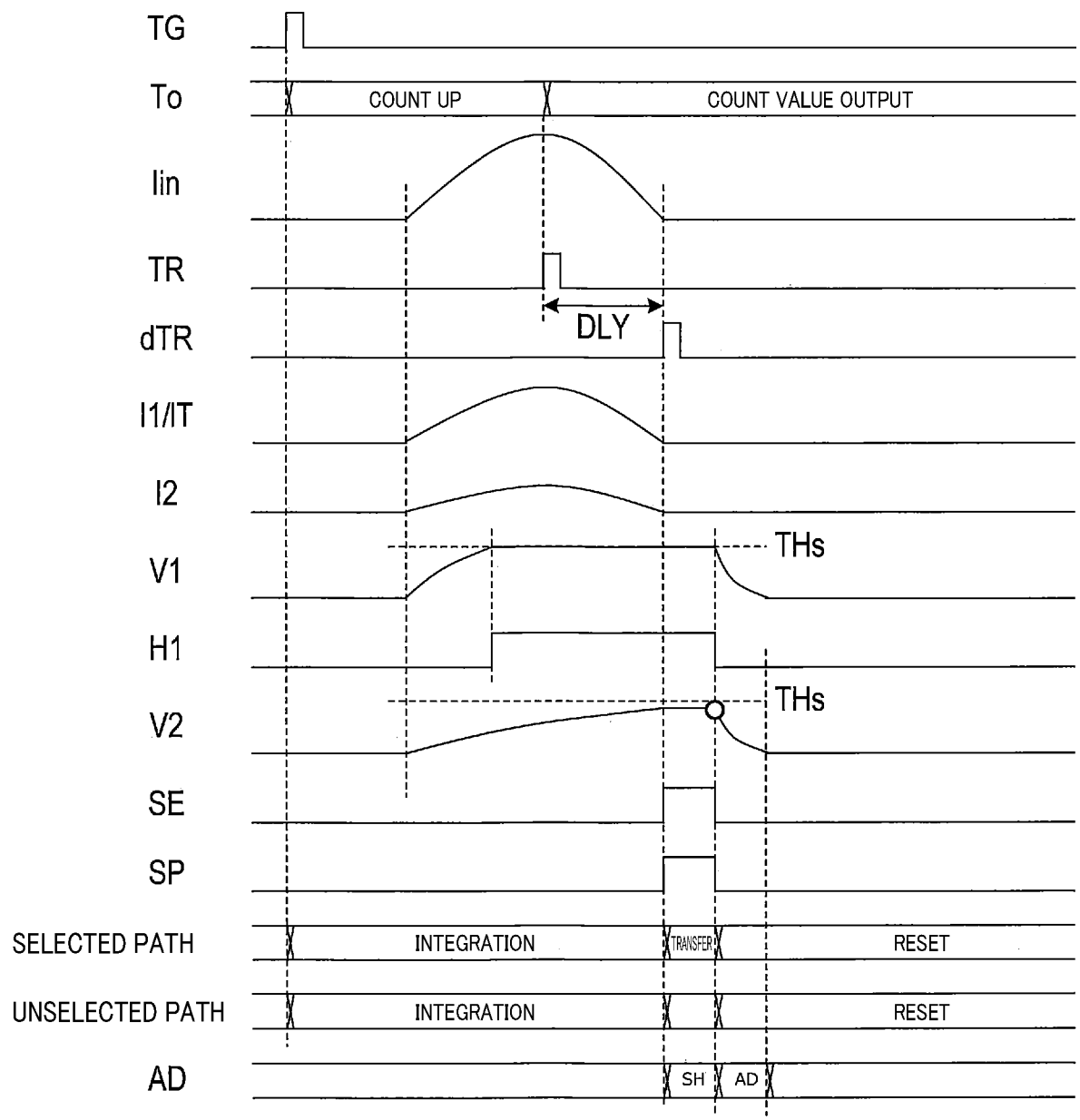
FIG. 3 is a timing chart showing operation of components of the laser radar device.

With reference to FIG. 3, operation of the components of the laser radar device 1 will be described taking as an example a case where only the detection signal V1 of the individual path L1 is saturated.

When a light emission trigger signal TG is outputted from the control section 12, a pulse laser beam is emitted from the light emitting section 2. When the light receiving section 3 receives reflected light from a target that reflects the laser beam, a light reception trigger signal TR is outputted from the trigger generation section 5 at a timing at which a signal level of a distance measurement signal IT obtained by dividing a light reception signal Iin exceeds the light reception threshold.

The measurement section 6 outputs, as time data To, a count value obtained by starting counting using a clock signal when the light emission trigger signal TG is inputted and stopping counting when the light reception trigger signal TR is inputted.

The control section 12 generates a delay trigger signal dTR obtained by delaying the light reception trigger signal TR. At this time, the delay time DLY is set to, for example, approximately ½ of an average pulse width of the light reception signal Iin.

Branch signals I1 and I2 obtained by dividing the light reception signal Iin are integrated by the hold circuits 71 to generate detection signals V1 and V2, respectively. When a signal level of the detection signal V1 exceeds the saturation threshold THs, the determination result H1 is changed to 1.

Subsequently, on the basis of a timing of the delay trigger signal dTR, a selection signal SE and a sampling signal SP are outputted from the control section 12. The individual path Li selected according to the selection signal SE is determined on the basis of the determination result obtained by the determination section 8. In this case, the determination result is {1000}, and thus the individual path L2 is selected. At this time, a digital value DU corresponding to the determination result obtained by the determination section 8 is outputted from the control section 12 to the processing section 13. In this case, DU=01 is outputted. At a timing at which connection between the individual path selected by the selection section 9 and the sampling section 10 is secured, the sampling signal SP is outputted only during a period required for the transfer of electric charge from the hold circuit 71 and for the AD conversion performed by the conversion section 11.

Thus, during a time from when the light emission trigger signal TG is outputted to when the delay trigger signal dTR is generated, a signal level of the detection signal V2 obtained by integrating the branch signal I2 is AD-converted by the conversion section 11 and outputted as a digital value DL to the processing section 13.

Next, a relationship of the light reception signal Iin with the digital value DL outputted from the conversion section 11 and the digital value DU outputted from the control section 12 will be described.

Figure 4:
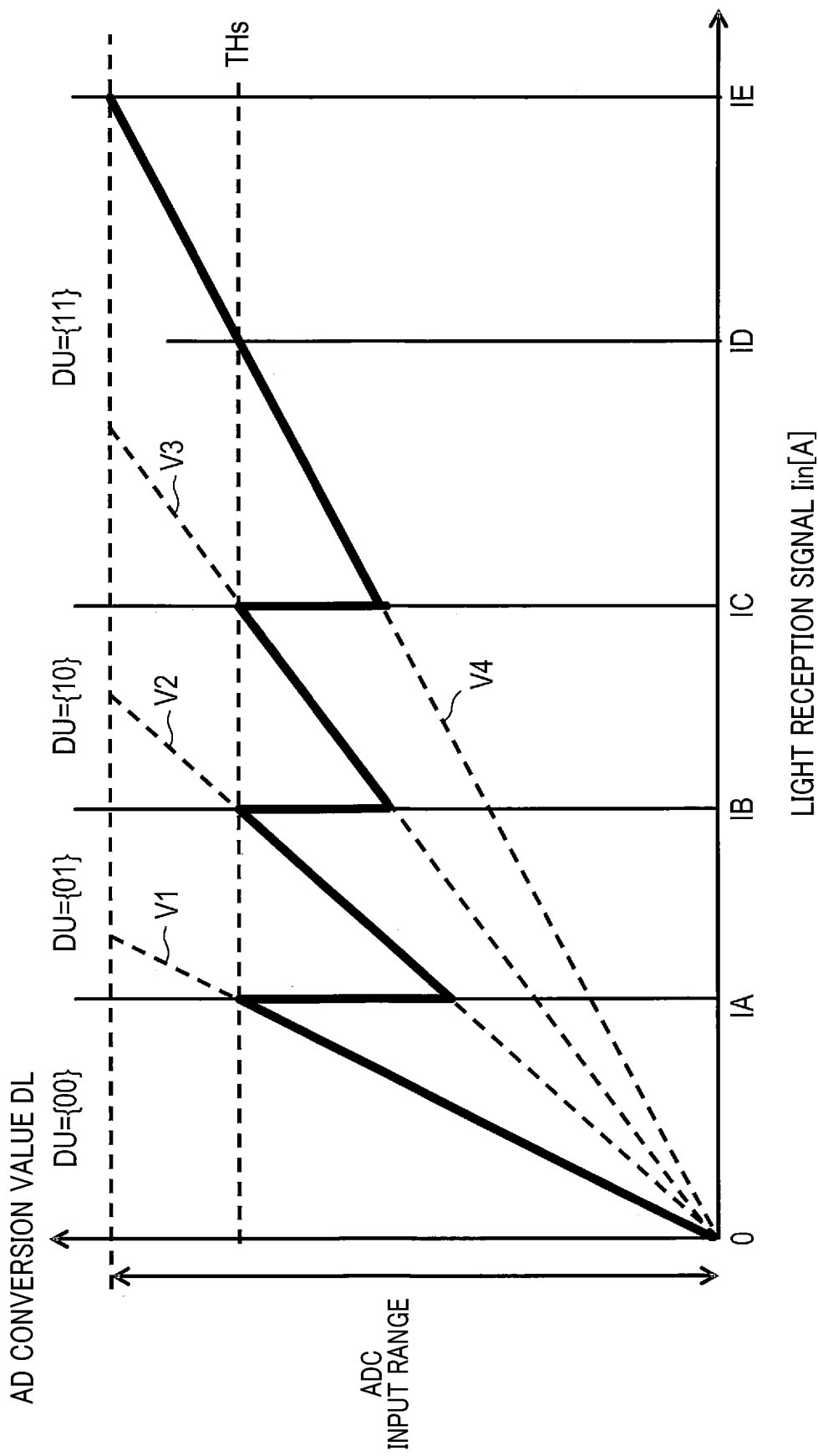
FIG. 4 is an explanatory diagram showing a relationship between operation of a light reception signal and an AD conversion value.

As shown in FIG. 4, when the light reception signal Iin is in the range of 0 to IA [A], the detection signals V1 to V4 all have a signal level of the saturation threshold THs or less, and the determination result obtained by the determination section 8 is {0000}. Thus, the individual path L1 is selected by the selection section 9, and the digital value DL outputted from the conversion section 11 is a value obtained by AD conversion of the signal level of the detection signal V1, and the digital value outputted from the control section 12 is DU=00.

When the light reception signal Iin is in the range of IA to IB [A], only the detection signal V1 has a signal level higher than the saturation threshold, and the determination result obtained by the determination section 8 is {1000}. Thus, the individual path L2 is selected by the selection section 9, and the digital value DL outputted from the conversion section 11 is a value obtained by AD conversion of the signal level of the detection signal V2, and the digital value outputted from the control section 12 is DU=01.

When the light reception signal Iin is in the range of IB to IC [A], the detection signals V1 and V2 have a signal level higher than the saturation threshold, and the determination result obtained by the determination section 8 is {1100}. Thus, the individual path L3 is selected by the selection section 9, and the digital value DL outputted from the conversion section 11 is a value obtained by AD conversion of the signal level of the detection signal V3, and the digital value outputted from the control section 12 is DU=10.

When the light reception signal Iin is in the range of IC to ID [A], the detection signals V1 to V3 have a signal level higher than the saturation threshold, and the determination result obtained by the determination section 8 is {1110}. Thus, the individual path L4 is selected by the selection section 9, and the digital value DL outputted from the conversion section 11 is a value obtained by AD conversion of the signal level of the detection signal V4, and the digital value outputted from the control section 12 is DU=11.

When the light reception signal Iin is in the range of ID to IE [A], the detection signals V1 to V4 all have a signal level higher than the saturation threshold, and the determination result obtained by the determination section 8 is {1111}. Thus, the individual path L4 is selected by the selection section 9, and the digital value DL outputted from the conversion section 11 is a value obtained by AD conversion of the signal level of the detection signal V4, and the digital value outputted from the control section 12 is DU=11.

1-3. Effects

The first embodiment described above in detail has the following effects.

(1a) In the laser radar device 1, the plurality of branch signals I1 to I4 having different gains are generated from the light reception signal Iin, and it is individually determined whether the signal levels of the detection signals V1 to V4 generated on the basis of the branch signals I1 to I4 exceed the saturation threshold THs. Furthermore, among the detection signals determined to have a signal level of the saturation threshold THs or less, the detection signal Vi having the highest gain is selected and AD-converted.

Therefore, according to the laser radar device 1, a gain of a signal supplied to the conversion section 11 can be optimized without performing feedback control, and thus the light reception signal Iin can be AD-converted with an accurate gain.

(1b) In the laser radar device 1, on the basis of the determination result obtained by the determination section 8, which is used to select the detection signal Vi to be AD-converted, the digital value DU indicating a high-order bit of AD conversion data is generated.

Therefore, the laser radar device 1 can provide AD conversion data that has a higher bit width and higher accuracy than the conversion result obtained by the conversion section 11. Thus, the conversion section 11 may be an AD converter having a small number of bits, and AD conversion with high accuracy can be achieved at low cost.

(1c) In the laser radar device 1, the saturation threshold THs is set to a value smaller than the maximum value of the input range of the conversion section 11. Accordingly, even when the saturation threshold THs varies for some reason, the saturation threshold does not exceed the input range of the conversion section 11, and this can prevent the occurrence of a coding error in the digital value DL which is an AD conversion value.

(1d) In the laser radar device 1, the plurality of branch signals I1 to I4 generated on the basis of the light reception signal Iin are each integrated, and one of the plurality of detection signals V1 to V4 obtained by the integration is AD-converted only once. Therefore, according to the laser radar device 1, the amount of data handled by the processing section 13 can be reduced.

2. Second Embodiment

2-1. Differences from the First Embodiment

The basic configuration of the second embodiment is the same as that of the first embodiment, and thus differences from the first embodiment will be described below. The same reference numerals as the first embodiment indicate the same configurations, and the preceding descriptions are referred to.

In the first embodiment described above, the hold circuit 71 of the holding section 7 includes a single capacitor. On the other hand, the second embodiment differs from the first embodiment in that a hold circuit 71a includes a plurality of capacitors.

Figure 5:
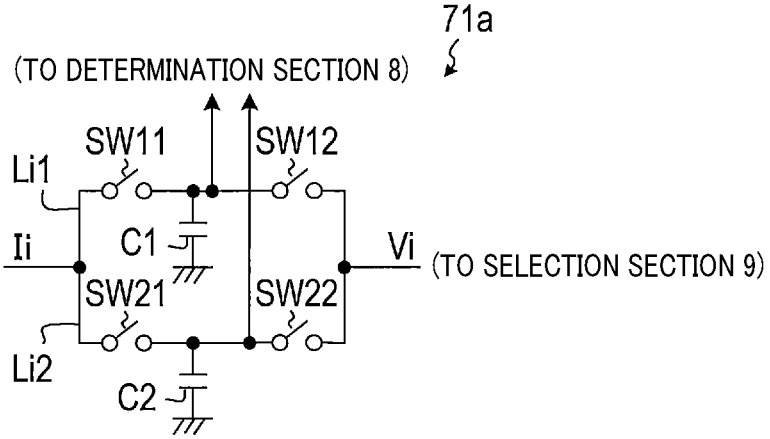
FIG. 5 is a circuit diagram showing a configuration of a hold circuit according to a second embodiment.

As shown in FIG. 5, the hold circuit 71a includes branch paths Li1 and Li2 which are two paths branched from the individual path Li.

Each branch path Lij is connected to a capacitor Cj and two switches SWj1 and SWj2. Note that j=1, 2.

One end of the capacitor Cj is connected to the branch path Lij, and the other end of the capacitor Cj is grounded. The switch SWj1 is provided between a connection point of the capacitor Cj in the branch path Lij and a branch point on a side to which the branch signal Ii is inputted. The switch SWj2 is connected between the connection point of the capacitor Cj in the branch path Lij and a branch point on a side from which the detection signal Vi is outputted.

Furthermore, the determination section 8 is configured to be capable of performing determination using the saturation threshold THs (hereinafter referred to as saturation determination) for each of the branch paths Li1 and Li2.

2-2. Operation

Figure 6:
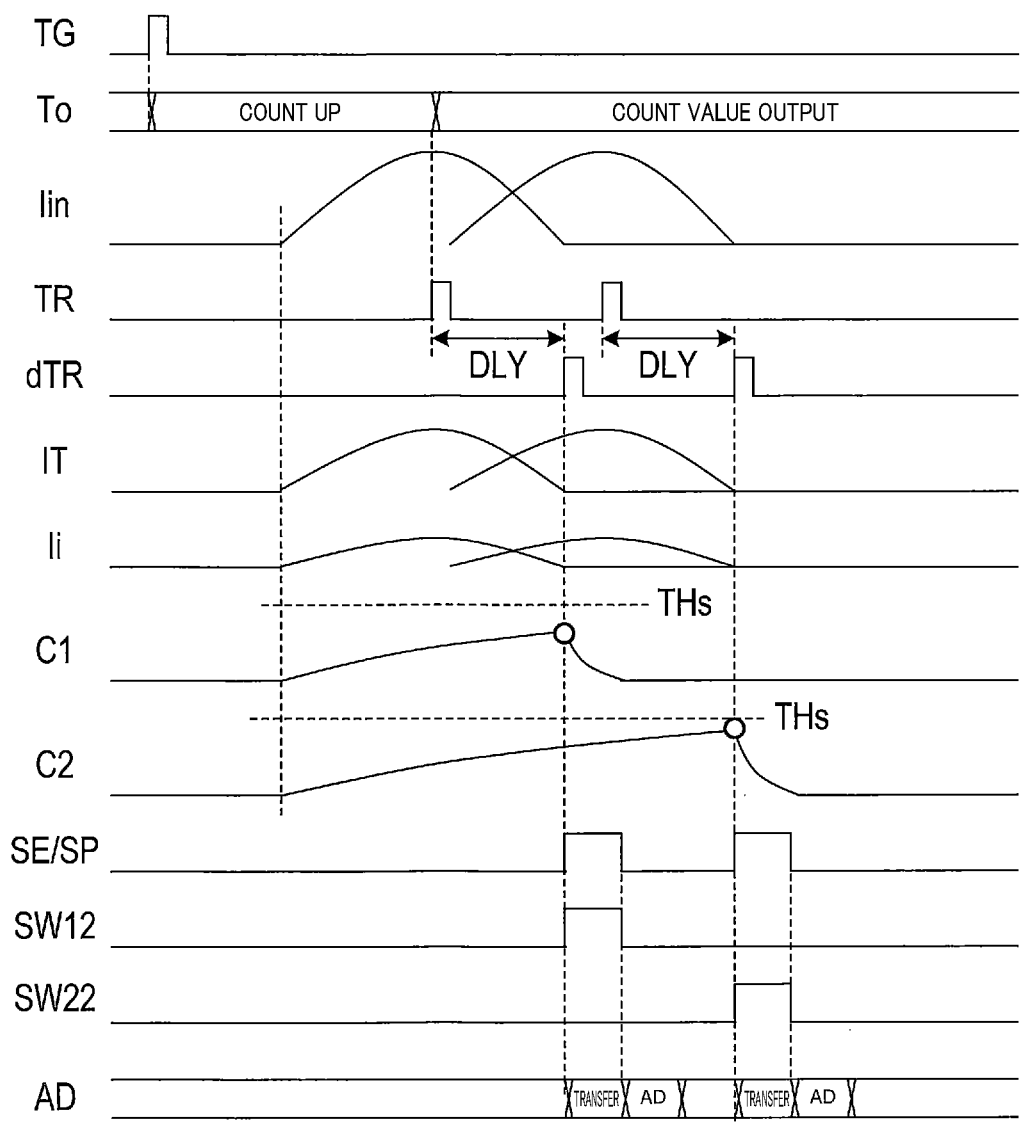
FIG. 6 is a timing chart of the second embodiment.

The switches SWj1 and SWj2 are operated according to instructions from the control section 12.
(1) Operation Pattern 1
For each measurement cycle, a set of the switches SW11 and SW12 and a set of the switches SW21 and SW22 are switched between ON and OFF in a complementary manner.
(2) Operation Pattern 2
When there is a probability that a plurality of pulses are received in a single measurement cycle, the operation may be performed as shown in FIG. 6.

Specifically, every time the distance measurement signal IT exceeds the light reception threshold, the trigger generation section 5 generates a trigger signal TR. For each trigger signal TR, the control section 12 generates a delay trigger signal dTR, and for each delay trigger signal dTR, the control section 12 generates a selection signal SE and a sampling signal SP.

In this case, the switches SW11 and SW21 are always in on states, and the switch SW12 is turned on at a timing of the first sampling signal SP and the switch SW22 is turned on at a timing of the second sampling signal SP.

2-3. Effects

The second embodiment described above in detail has the effects (1a) to (1c) of the first embodiment described above, and further has the following effects.

(2a) In the present embodiment, in the case of the operation in the operation pattern 1, for each measurement cycle, a branch path used for the integration of the branch signal Ii and a branch path used for the AD conversion can be alternately switched, and this makes it possible to sufficiently secure allowable processing time for the AD conversion performed by the conversion section 11. As a result, the conversion section 11 may be an AD converter at a lower speed and lower cost.

(2b) In the present embodiment, in the case of the operation in the operation pattern 2, even when two overlapping pulses arrive in a single measurement cycle, the pulses can be individually integrated in the two branch paths, so that an AD conversion result can be obtained for each of the pulses.

In the present embodiment, the case where the number of branch paths is two has been described, but the number of branch paths may be three or more.

Furthermore, in the case where the operation is performed only in the operation pattern 2, the switches SW11 and SW21 may be omitted, and the switches SW12 and SW22 may be integrated with the selection section 9.

3. Third Embodiment

3-1. Differences from the First Embodiment

The basic configuration of the third embodiment is the same as that of the first embodiment, and thus differences from the first embodiment will be described below. The same reference numerals as the first embodiment indicate the same configurations, and the preceding descriptions are referred to.

The third embodiment differs from the first embodiment in configuration of an individual circuit provided in each of the individual paths L1 to L4 in the holding section 7.

Figure 7:
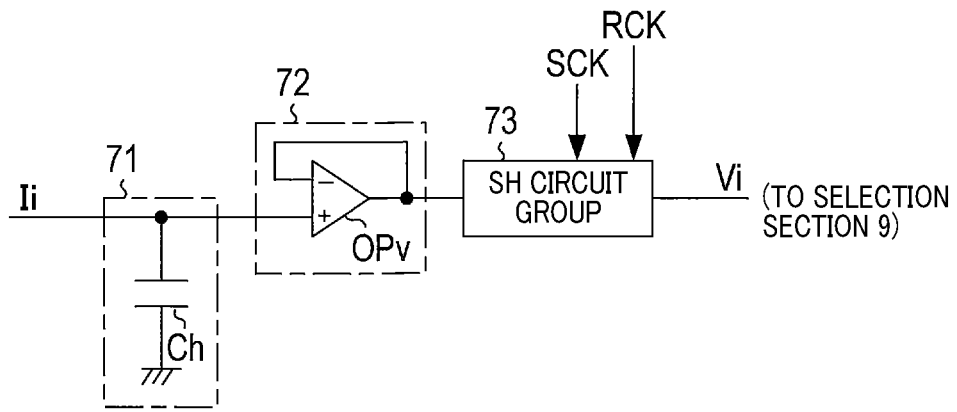
FIG. 7 is a block diagram showing a configuration of a circuit provided in each individual path according to a third embodiment.

As shown in FIG. 7, in the present embodiment, each individual path Li includes the hold circuit 71, and further includes a voltage follower circuit 72 and a sample-and-hold circuit group 73.

The voltage follower circuit 72 is configured by an operational amplifier OPv. An output of the hold circuit 71 is applied to a non-inverting input of the voltage follower circuit 72, and an output of the voltage follower circuit 72 is connected to an inverting input of the voltage follower circuit 72.

The sample-and-hold circuit group 73 includes a plurality of sample-and-hold circuits. The sample-and-hold circuits each sequentially sample and hold an output of the voltage follower circuit 72 according to a sampling clock SCK from the control section 12. Furthermore, according to a read clock RCK from the control section 12, the sample-and-hold circuits each read the held signals in the order in which the signals have been sampled, and output the read signals to the selection section 9.

3-2. Operation

Figure 8:
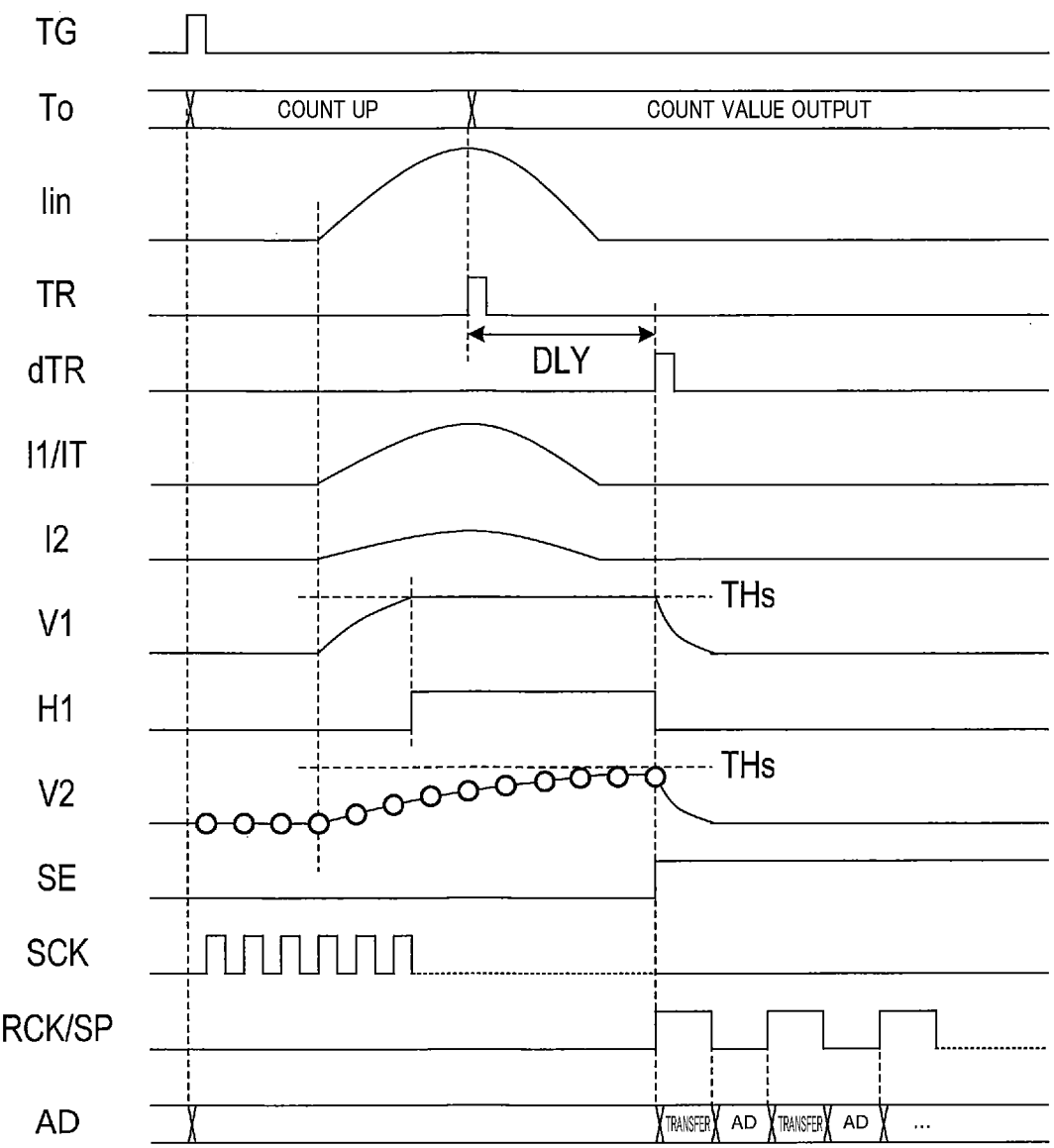
FIG. 8 is a timing chart of the third embodiment.

In the present embodiment, as shown in FIG. 8, from a timing of the trigger signal TG to a timing of the delay trigger signal dTR, the control section 12 outputs a sampling clock SCK. Thus, in each of the individual paths L1 to L4, a detection signal Vi which is an output of the hold circuit 71 is sampled and held by the sample-and-hold circuit group 73 according to the sampling clock SCK.

Subsequently, at the timing of the delay trigger signal dTR, the control section 12 selects an individual path Li by outputting a selection signal SE. While the individual path Li is selected, the control section 12 sequentially and individually reads a sampled-and-held value from the sample-and-hold circuit group 73 in the selected individual path Li by outputting a read clock RCK and a sampling signal SP, and transfers the read value to the conversion section 11. The conversion section 11 sequentially and individually performs AD conversion of the transferred signal to generate a plurality of digital values DL in which a waveform of the detection signal Vi is sampled.

3-3. Effects

The third embodiment described above in detail has the effects (1a) to (1c) of the first embodiment described above, and further has the following effect.

(3a) In the present embodiment, since the plurality of digital values DU indicating the waveform of the detection signal Vi are obtained, information can be generated considering the waveform.

4. Fourth Embodiment

4-1. Differences from the First Embodiment

The basic configuration of the fourth embodiment is the same as that of the first embodiment, and thus differences from the first embodiment will be described below. The same reference numerals as the first embodiment indicate the same configurations, and the preceding descriptions are referred to.

The fourth embodiment differs from the first embodiment in configuration provided in each of the individual paths L1 to L4 in the holding section 7.

Figure 9:
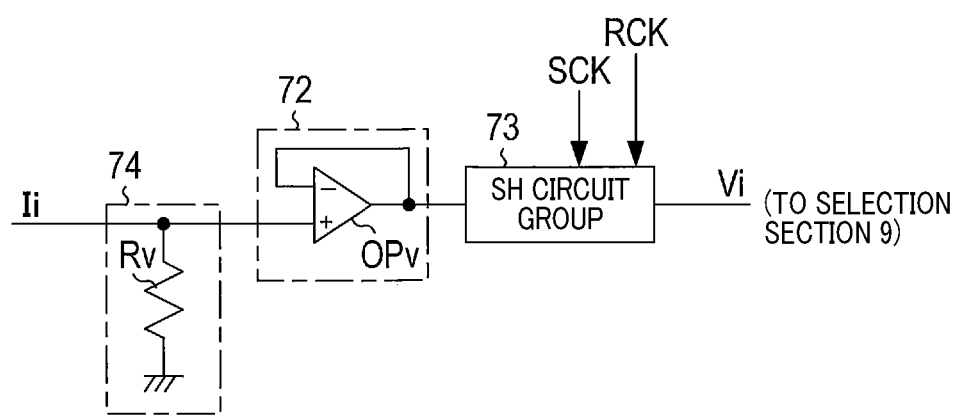
FIG. 9 is a block diagram including a circuit diagram showing a configuration of a circuit provided in each individual path according to a fourth embodiment.

As shown in FIG. 9, in the present embodiment, each individual path Li includes a voltage conversion circuit 74, the voltage follower circuit 72, and the sample-and-hold circuit group 73.

That is, in comparison with the case of the third embodiment shown in FIG. 7, instead of the hold circuit 71, the voltage conversion circuit 74 is provided.

The voltage conversion circuit 74 includes a resistor Rv in which one end is connected to the individual path Li and the other end is grounded. Thus, the voltage conversion circuit 74 converts a branch signal Ii into a voltage signal having the same signal waveform as that of the branch signal Ii.

4-2. Operation

Figure 10:
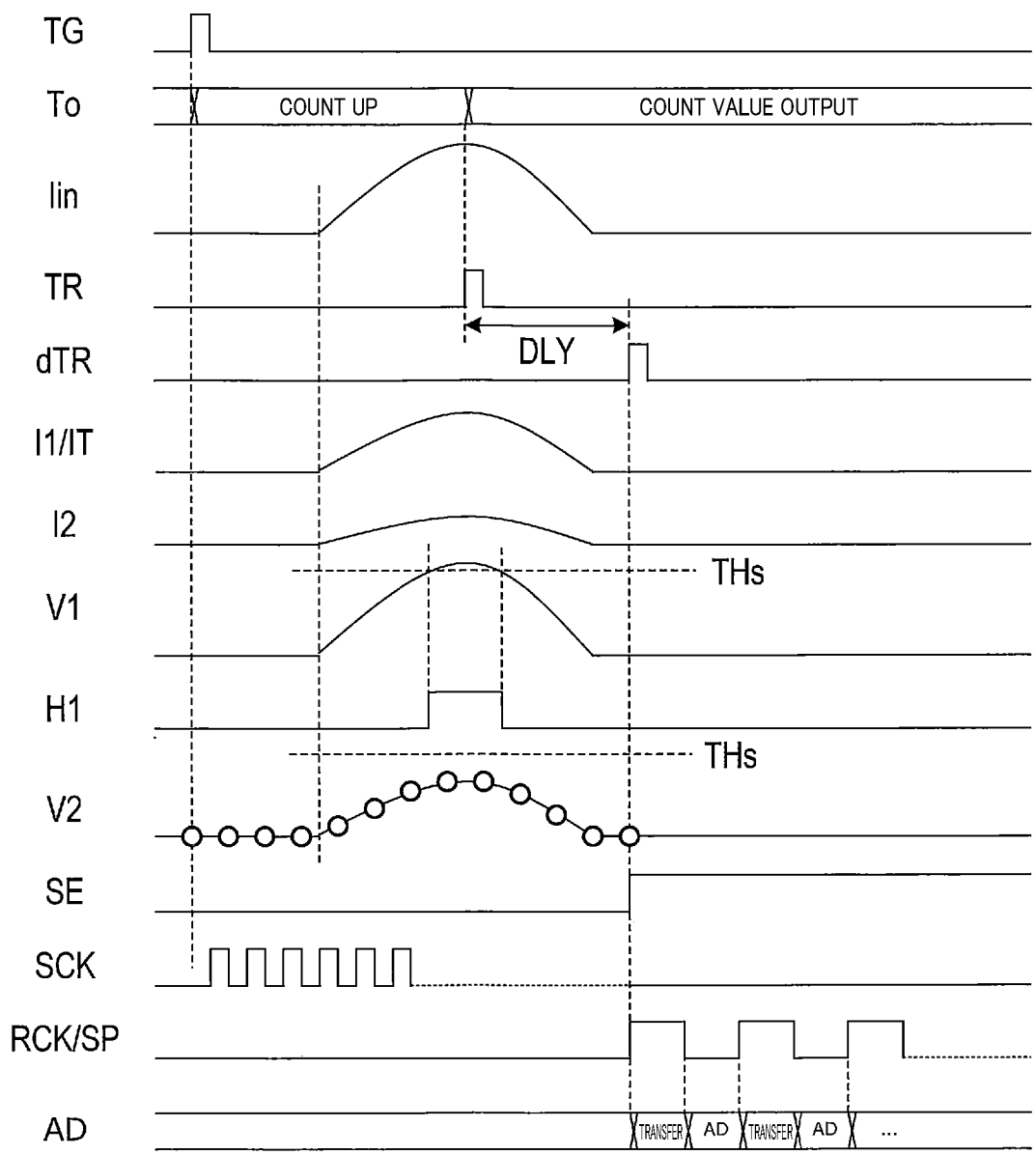
FIG. 10 is a timing chart of the fourth embodiment.

As shown in FIG. 10, operation of the control section 12 is similar to the operation of the control section 12 of the third embodiment. However, the sample-and-hold circuit group 73 samples and holds not a waveform of an integrated value of the branch signal Ii but a waveform of the branch signal Ii itself.

4-3. Effects

The fourth embodiment described above in detail has the effects (1a) to (1c) of the first embodiment described above, and further has the following effect.

(4a) In the present embodiment, the digital value DU indicating the waveform of the branch signal Ii and thus the waveform of the light reception signal Iin can be obtained, and information can be generated considering the waveforms.

In the present embodiment, the voltage follower circuit 72 may be omitted.

5. Fifth Embodiment

5-1. Differences from the First Embodiment

The basic configuration of the fifth embodiment is the same as that of the first embodiment, and thus differences from the first embodiment will be described below. The same reference numerals as the first embodiment indicate the same configurations, and the preceding descriptions are referred to.

Figure 11:
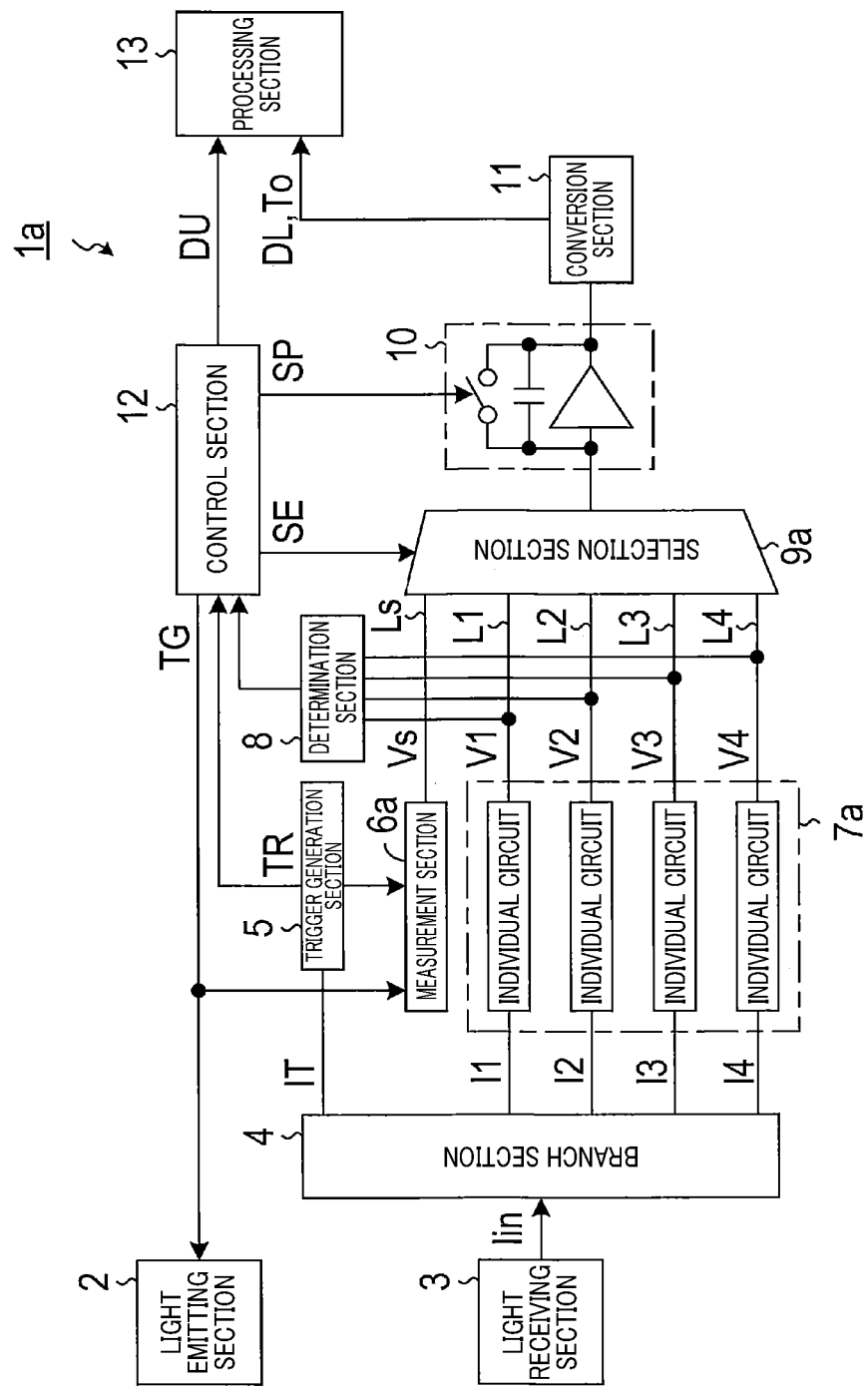
FIG. 11 is a block diagram showing a configuration of a laser radar device according to a fifth embodiment.

As shown in FIG. 11, a laser radar device 1a of the fifth embodiment differs from the laser radar device 1 of the first embodiment in configuration of a measurement section 6a, a holding section 7a, and a selection section 9a.

The measurement section 6a generates a detection signal VT on the basis of the light emission trigger signal TG and the light reception trigger signal TR, and supplies the detection signal VT to the selection section 9a.

Figure 12:
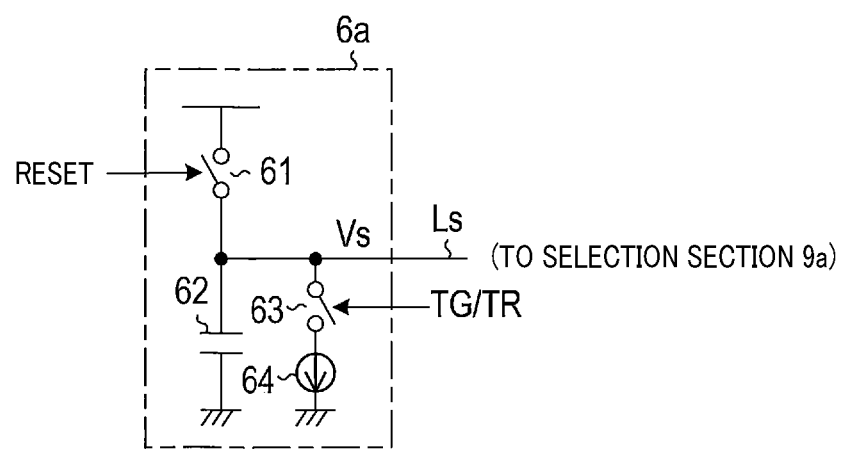
FIG. 12 is a circuit diagram showing a configuration of a measurement section.

Specifically, as shown in FIG. 12, the measurement section 6a includes a reset switch 61, a capacitor 62, a discharge switch 63, and a constant current circuit 64.

A power supply voltage is applied to one end of the capacitor 62 through the reset switch 61, and the other end of the capacitor 62 is grounded. One end of the constant current circuit 64 is connected to the non-grounded end of the capacitor 62 through the discharge switch 63, and the other end of the constant current circuit 64 is grounded. The non-grounded end of the capacitor 62 is connected to the selection section 9a through a signal path Ls. A signal outputted through the signal path Ls is referred to as a detection signal Vs.

In the holding section 7a, an individual circuit is provided in each of the individual paths L1 to L4. The individual circuit may be the hold circuit 71 described in the first embodiment, or may be the hold circuit 71a described in the second embodiment. Alternatively, the individual circuit may be a combination of the hold circuit 71, the voltage follower circuit 72, and the sample-and-hold circuit group 73 described in the third embodiment, or may be a combination of the voltage conversion circuit 74, the voltage follower circuit 72, and the sample-and-hold circuit group 73 described in the fourth embodiment.

The selection section 9a selects one of the individual paths L1 to L4 and the signal path Ls from the measurement section 6a according to the selection signal SE, and connects the selected path to the sampling section 10.

5-2. Operation

Figure 13:
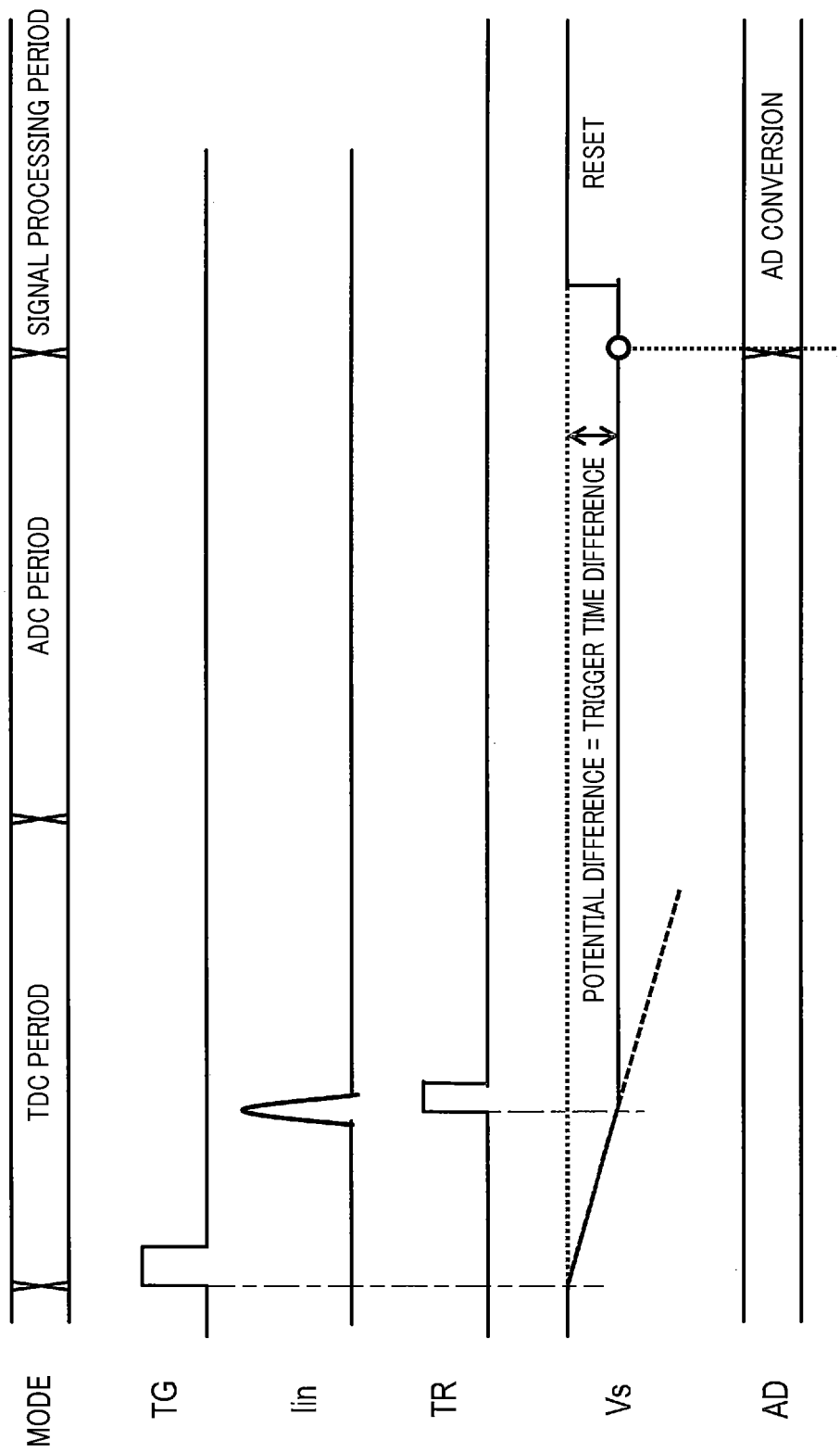
FIG. 13 is a timing chart of the fifth embodiment.

In the present embodiment, as shown in FIG. 13, a single measurement cycle is divided into a TDC period, an ADC period, and a signal processing period.

At the moment when a light emission trigger signal TG is outputted, the TDC period is started, and when a preset time has elapsed, the mode is switched to the ADC period, and subsequently, the mode is switched to the signal processing period. The total period of the TDC period and the ADC period is set to be not less than time required for a laser beam to travel back and forth a maximum detection distance of the device. The TDC period is set, for example, considering a distance that provides a light reception signal having the magnitude that allows the light reception signal to be saturated even in the individual path L4 which has the lowest gain. In the measurement section 6a, a capacitance of the capacitor 62 and a constant current value of the constant current circuit 64 are set so that a voltage is changed at a constant rate at least during the TDC period.

In the measurement section 6a having such a configuration, the reset switch 61 is turned on for a given period before the light emission trigger signal TG is outputted. Thus, the capacitor 62 is charged to the power supply voltage.

The discharge switch 63 is turned on at a timing of the light emission trigger signal TG and turned off at a timing of the light reception trigger signal TR. Thus, at the timing of the light emission trigger signal TG, discharge of the charged electric charge of the capacitor is started, and accordingly the signal level of the detection signal Vs is reduced at a constant rate, and at the timing of the light reception trigger signal TR, the discharge is stopped. Then, until the reset switch 61 is turned on again, the signal level of the detection signal Vs is held to be the signal level when the discharge is stopped. Thus, the difference between the signal level of the detection signal Vs and the power supply voltage when the discharge is stopped corresponds to the time difference between the timing of the light emission trigger signal TG and the timing of the light reception trigger signal TR, i.e., the distance to the target.

The holding section 7a is operated as described in the above embodiment.

When the mode is switched to the signal processing period, the control section 12 selects the signal path Ls and performs AD conversion of a signal from the measurement section 6a, and then selects one of the plurality of individual paths L1 to L4 and performs AD conversion of a signal held by the holding section 7a.

5-3. Effects

The fifth embodiment described above in detail has the effects (1a) to (1c) of the first embodiment described above, and further has the following effect.

(5a) According to the present embodiment, since the detection signal Vs generated by the measurement section 6a is AD-converted by using the conversion section 11 which is also used for the AD conversion of the detection signal Vi outputted from the holding section 7a, the area of the circuit can be reduced.

6. Sixth Embodiment

6-1. Differences from the First Embodiment

The basic configuration of the sixth embodiment is the same as that of the first embodiment, and thus differences from the first embodiment will be described below. The same reference numerals as the first embodiment indicate the same configurations, and the preceding descriptions are referred to.

Figure 17:
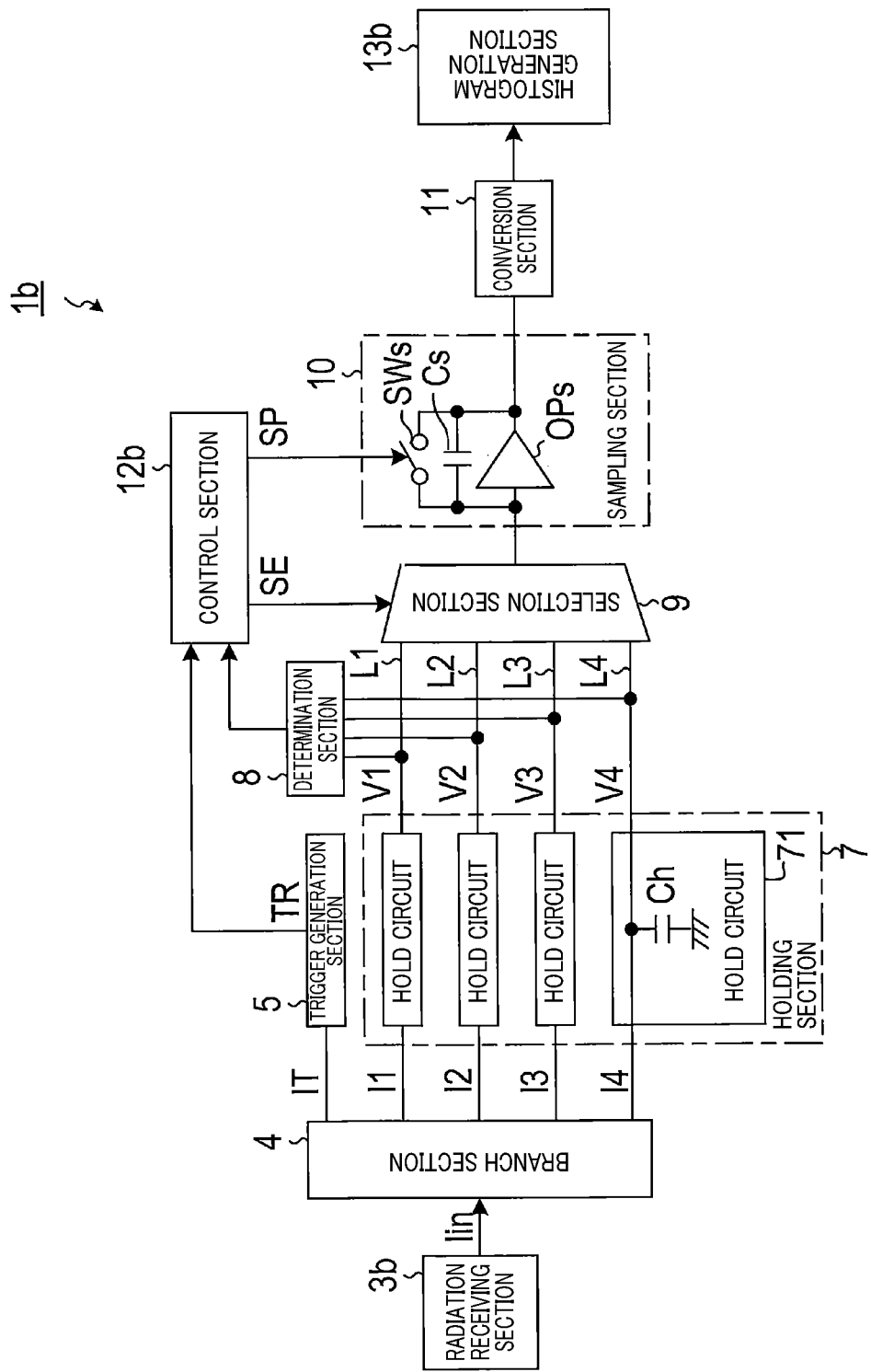
FIG. 17 is a block diagram showing a configuration of a radiation energy analysis device according to a sixth embodiment.

As shown in FIG. 17, a radiation energy analysis device 1b of the sixth embodiment differs from the laser radar device 1 of the first embodiment in that the light emitting section 2 and the measurement section 6 are omitted, the light receiving section 3 is replaced with a radiation receiving section 3b, the processing section 13 is replaced with a histogram generation section 13b, and part of the control performed by the control section 12 is different.

The radiation receiving section 3b includes one or more light receiving elements that receive radiation to be measured and output a light reception signal Iin having a current value level corresponding to a light reception intensity of the radiation. The light receiving element may be, for example, a direct-conversion-type radiation detector that is capable of directly converting radiation into an electric current and is typified by cadmium telluride. Alternatively, the light receiving element may be an indirect-conversion-type radiation detector in which a scintillator that converts radiation into visible light is combined with a PD array, an APD array, or a SPAD array that converts visible light into an electric current.

A control section 12b is operated in the same manner as the control section 12 of the first embodiment, except that the control section 12b does not perform the process of outputting a light emission trigger signal TG and the process of generating a digital value DU indicating a high-order bit of AD conversion data according to the determination result obtained by the determination section 8.

Figure 18:
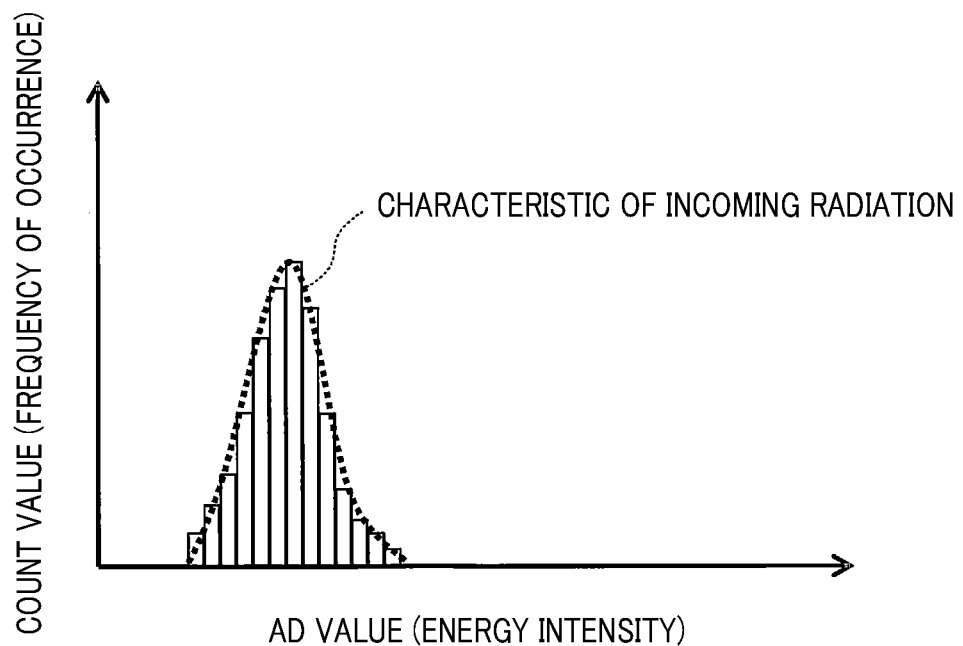
FIG. 18 is an explanatory diagram illustrating a histogram generated by a histogram generation section.

The histogram generation section 13b generates a histogram shown in FIG. 18 by counting, for each AD conversion data value (hereinafter referred to as AD value) generated by the conversion section 11, a frequency of occurrence of the AD value. The AD value indicates an energy intensity of the received radiation. Thus, the histogram shows a characteristic of radiation intensity against frequency.

6-2. Effects

The sixth embodiment described above in detail has the effects (1a), (1c), and (1d) of the first embodiment described above, and further has the following effect.

(6a) According to the radiation energy analysis device 1b, an energy intensity of incident radiation can be acquired as the AD value, and by showing a distribution of the AD values using a histogram, the energy of the radiation can be analyzed.

7. Other Embodiments

The embodiments of the present disclosure have been described above, but the present disclosure is not limited to the above embodiments and may be modified in various manners.

Figure 14:
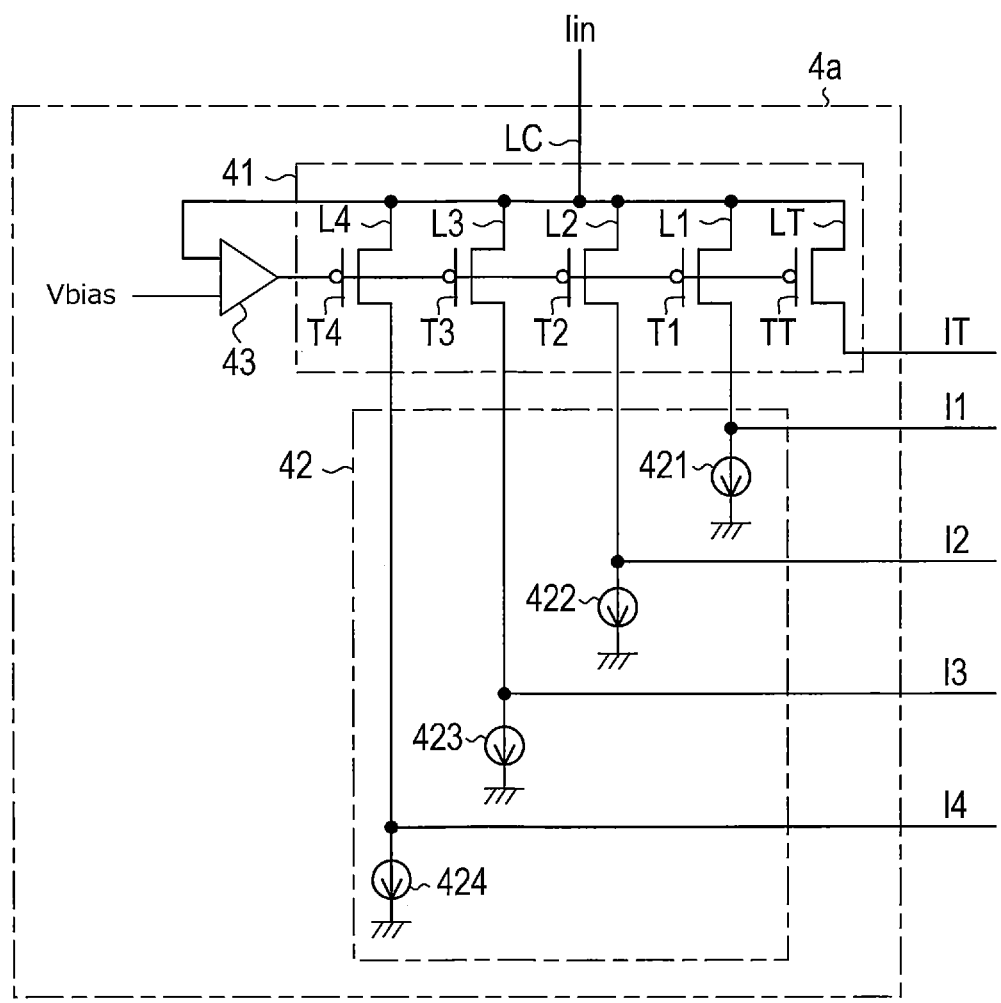
FIG. 14 is a circuit diagram showing a modification of the branch section.

(7a) In the above embodiments, the bias voltage Vbias is directly applied to the transistors TT and T1 to T4 of the shunt circuit 41, but the present disclosure is not limited to this. For example, as with a branch section 4a shown in FIG. 14, the bias voltage Vbias may be applied to the transistors TT and T1 to T4 through a regulation amplifier 43. The regulation amplifier 43 is configured by an operational amplifier, and controls a control target connected to an output of the regulation amplifier 43 so that a potential of a portion connected to an inverting input of the regulation amplifier 43 matches a potential applied to a non-inverting input of the regulation amplifier 43. In this case, an input impedance of the shunt circuit 41 can be reduced to 1/A times. Note that A represents an amplification factor of the regulation amplifier. As a result, an input end to which the light reception signal Iin is inputted can be biased to any potential, and bias controllability of the light receiving element used in the light receiving section 3 can be improved.

(7b) In the above embodiments, the branch section 4 divides the light reception signal Iin by using the shunt circuit 41 to generate the branch signals I1 to I4 and the distance measurement signal IT, but the present disclosure is not limited to this. For example, as with a branch section 4b shown in FIG. 15 and a branch section 4c shown in FIG. 16, a current mirror circuit 46 or 49 may be used to constitute the branch section.

Figure 15:
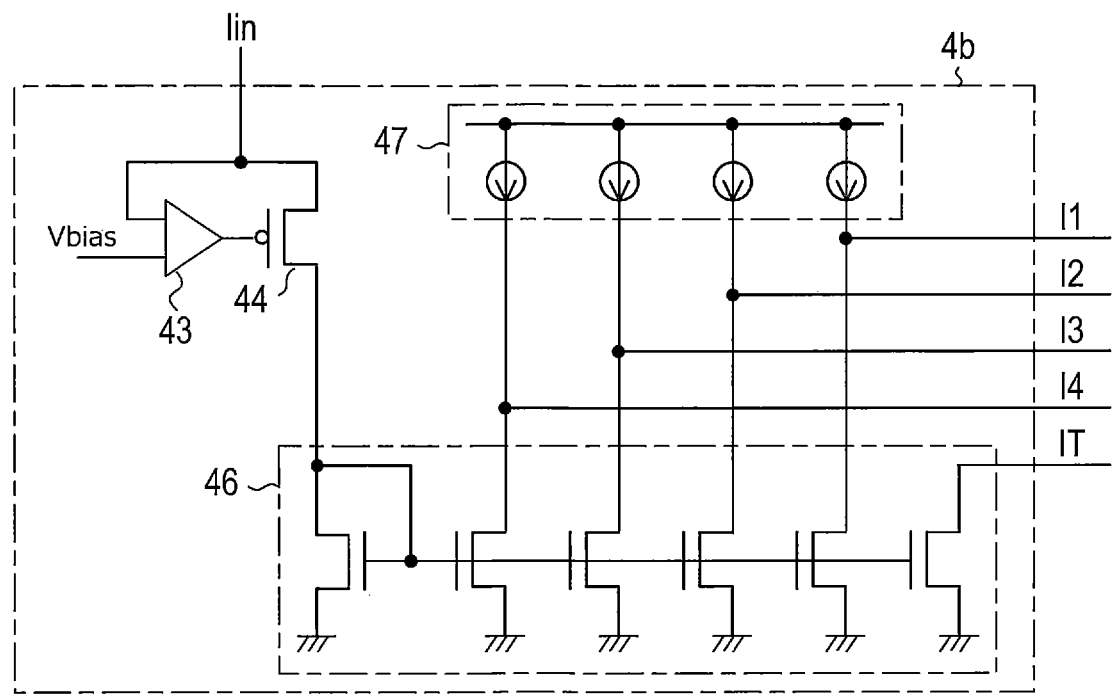
FIG. 15 is a circuit diagram showing a modification of the branch section.

The branch section 4b shown in FIG. 15 includes the regulation amplifier 43, a transistor 44, the current mirror circuit 46, and a bias removal circuit 47. In the transistor 44, a light reception signal Iin is applied to a source, and a bias voltage Vbias is applied to a gate through the regulation amplifier 43. The current mirror circuit 46 generates branch signals I1 to I4 and a distance measurement signal IT that are proportional to the light reception signal Iin supplied through the transistor 44. The bias removal circuit 47 includes a constant current circuit that is connected to each of four transistors that generate the branch signals I1 to I4 in the current mirror circuit 46. The bias removal circuit 47 has the same function as that of the bias removal circuit 42.

Figure 16:
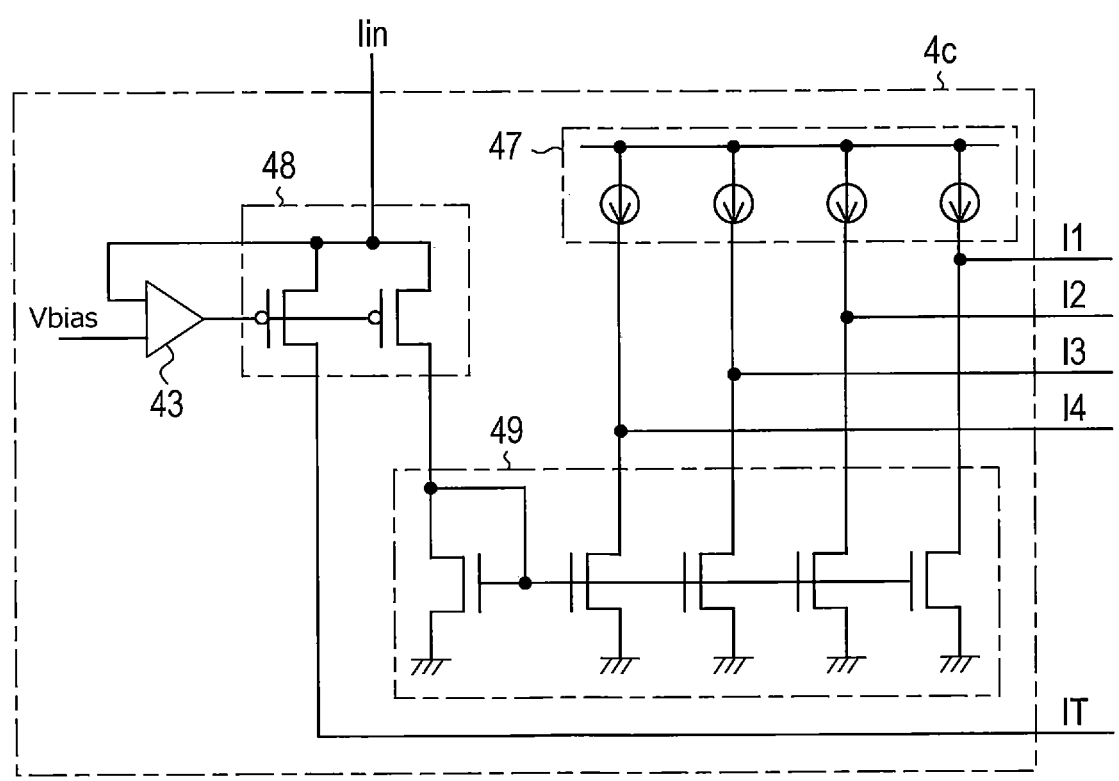
FIG. 16 is a circuit diagram showing a modification of the branch section.

The branch section 4c shown in FIG. 16 includes the regulation amplifier 43, a shunt circuit 48, the current mirror circuit 49, and the bias removal circuit 47.

The shunt circuit 48 is configured by two transistors in each of which a light reception signal Iin is applied to a source and a bias voltage Vbias is applied to a gate through the regulation amplifier 43. A current signal that flows through a drain of one of the transistors is outputted as a distance measurement signal IT, and a current signal that flows through a drain of the other transistor is supplied to the current mirror circuit. The current mirror circuit 49 generates branch signals I1 to I4 that are proportional to the current signal supplied from the shunt circuit 48.

(7c) In the above embodiments, the input signal is the light reception signal Iin from the light receiving section 3, but the present disclosure is not limited to this. The input signal only needs to be a signal in which information is indicated by a current value, and the input signal may be a current signal outputted from various sensors and circuits.

(7d) In the above embodiments, the AD conversion is performed as the processing for the signal outputted from the selection section 9, but the present disclosure is not limited to this. As long as an input dynamic range of a device that processes an input signal inputted to the branch section 3 is narrower than a range in which the input signal is changed, any processing performed by the device can be applied regardless of the content of the processing.

(7e) In the above embodiments, the signal processing device is applied to the laser radar device and the radiation energy analysis device, but the present disclosure is not limited to this. The signal processing device can be applied to various devices that analyze or use a light signal.

(7f) In the above embodiments, a plurality of functions of a single component may be implemented by a plurality of components, or a single function of a single component may be implemented by a plurality of components. Furthermore, a plurality of functions of a plurality of components may be implemented by a single component, or a single function implemented by a plurality of components may be implemented by a single component. Furthermore, part of the configuration of the embodiments may be omitted. Furthermore, at least part of the configuration of the embodiments may be added to or substituted by another part of the configuration of the embodiments.

(7g) Other than the signal processing device including the branch section 4, the determination section 8, the selection section 9, and the control section 12 described above, the present disclosure may also be implemented in various forms such as a system including the signal processing device as a component, and a gain setting method.

A signal processing device according to an aspect of the present disclosure includes a branch section (4, 4a to 4c), a selection section (9, 9a), a determination section (8), and a control section (12).

The branch section generates, from an input signal which is a current signal, a plurality of branch signals that are proportional to the input signal and have different signal intensities, and supplies the plurality of branch signals to different respective individual paths. The selection section selects one of the plurality of individual paths and outputs a signal supplied through the selected individual path. The determination section determines whether in each of the plurality of individual paths, a magnitude of a signal supplied to the selection section is in a preset allowable range. The control section causes the selection section to select the individual path having a highest gain among the individual paths in which the magnitude of the signal is determined by the determination section to be in the allowable range.

According to such a configuration, a gain of a signal supplied to a device, a circuit, or the like at a later stage can be optimized without performing feedback control.

What is claimed is:

1. A signal processing device comprising:
a branch section configured to generate, from an input signal which is a current signal, a plurality of branch signals that are proportional to the input signal and have different signal intensities and to supply the plurality of branch signals to respective different individual paths of a plurality of individual paths;
a selection section configured to select a selected individual path from the plurality of individual paths and output a signal supplied through the selected individual path;
a determination section configured to determine whether in each of the plurality of individual paths, a magnitude of a signal supplied to the selection section is in a preset allowable range; and
a control section configured to cause the selection section to select an individual path having a highest gain among the plurality of individual paths in which the magnitude of the signal is determined by the determination section to be in the preset allowable range, wherein
each of the plurality of individual paths further includes a hold circuit configured to integrate a respective branch signal that flows through a corresponding one of the plurality of individual paths, and
each of the plurality of individual paths further includes a sample-and-hold circuit group including a plurality of sample-and-hold circuits configured to sample and hold an output of the hold circuit at different timings, and
the control section is configured to cause the sample-and-hold circuit group to be operated so that a value held by the plurality of sample-and-hold circuits of the selected individual path selected by the selection section is sequentially and individually read and supplied to the selection section.

2. The signal processing device according to claim 1, wherein the branch section is configured to generate the plurality of branch signals from a light reception signal by using a current mirror circuit.

3. The signal processing device according to claim 1, wherein the branch section is configured to generate the plurality of branch signals by dividing a light reception signal by using a shunt circuit including a plurality of transistors that have different amplification factors and are connected in parallel to each other and to which a same bias voltage is applied.

4. The signal processing device according to claim 3, wherein the branch section is configured to supply the same bias voltage to the shunt circuit through a regulation amplifier.

5. The signal processing device according to claim 1, wherein each of the plurality of individual paths further includes a voltage follower circuit at a stage before the plurality of sample-and-hold circuits.

6. The signal processing device according to claim 1, wherein the determination section is configured to use a saturation threshold to determine whether a value is in an input range of a conversion section, and the saturation threshold is set to a value smaller than an upper limit value of the input range.

7. The signal processing device according to claim 1, further comprising a conversion section configured to perform analog-digital conversion of a signal supplied through the selected individual path selected by the selection section.

8. The signal processing device according to claim 7, wherein the control section is configured to generate, on the basis of a determination result obtained by the determination section using a determination signal, a high-order bit for a conversion result obtained by the conversion section.

9. The signal processing device according to claim 7, further comprising a histogram generation section that generates a histogram showing a frequency distribution of intensities of the input signal by counting a number of occurrences of each conversion value in the conversion section.

10. A signal processing device comprising:
a branch section configured to generate, from an input signal which is a current signal, a plurality of branch signals that are proportional to the input signal and have different signal intensities and to supply the plurality of branch signals to respective different individual paths of a plurality of individual paths;
a selection section configured to select a selected individual path from the plurality of individual paths and output a signal supplied through the selected individual path;
a determination section configured to determine whether in each of the plurality of individual paths, a magnitude of a signal supplied to the selection section is in a preset allowable range; and
a control section configured to cause the selection section to select an individual path having a highest gain among the plurality of individual paths in which the magnitude of the signal is determined by the determination section to be in the preset allowable range,
wherein each of the plurality of individual paths further includes
a voltage conversion circuit configured to convert a corresponding one of the plurality of branch signals into a voltage signal, and
a sample-and-hold circuit group including a plurality of sample-and-hold circuits configured to sample and hold, at different timings, a voltage signal outputted from the voltage conversion circuit, and wherein the control section is configured to cause the sample-and-hold circuit group to be operated so that a value held by the plurality of sample-and-hold circuits of the selected individual path selected by the selection section is sequentially and individually read and supplied to the selection section.

11. The signal processing device according to claim 10, wherein the branch section is configured to generate the plurality of branch signals from a light reception signal by using a current mirror circuit.

12. The signal processing device according to claim 10, wherein the branch section is configured to generate the plurality of branch signals by dividing a light reception signal by using a shunt circuit including a plurality of transistors that have different amplification factors and are connected in parallel to each other and to which a same bias voltage is applied.

13. The signal processing device according to claim 12, wherein the branch section is configured to supply the same bias voltage to the shunt circuit through a regulation amplifier.

14. The signal processing device according to claim 10, wherein the determination section is configured to use a saturation threshold to determine whether a value is in an input range of a conversion section, and the saturation threshold is set to a value smaller than an upper limit value of the input range.

15. The signal processing device according to claim 10, further comprising a conversion section configured to perform analog-digital conversion of a signal supplied through the selected individual path selected by the selection section.

16. The signal processing device according to claim 15, wherein the control section is configured to generate, on the basis of a determination result obtained by the determination section using a determination signal, a high-order bit for a conversion result obtained by the conversion section.

17. The signal processing device according to claim 15, further comprising a histogram generation section that generates a histogram showing a frequency distribution of intensities of the input signal by counting a number of occurrences of each conversion value in the conversion section.

\* \* \* \* \*